US009786536B2

(12) United States Patent
Kudel et al.

(10) Patent No.: US 9,786,536 B2
(45) Date of Patent: Oct. 10, 2017

(54) RETICLE RACK SYSTEM

(71) Applicant: Microchip Technology Incorporated, Chandler, AZ (US)

(72) Inventors: Sean Kudel, Chandler, AZ (US); Andy Escandon, Gilbert, AZ (US); Spencer Read, Mesa, AZ (US); Gilbert Hernandez, Gilbert, AZ (US); Ryan Irish, Chandler, AZ (US); Joanne Valestin, Queen Creek, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/355,289

(22) Filed: Nov. 18, 2016

(65) Prior Publication Data
US 2017/0158429 A1 Jun. 8, 2017

Related U.S. Application Data

(60) Provisional application No. 62/264,098, filed on Dec. 7, 2015.

(51) Int. Cl.
| | | |
|---|---|---|
| *H01L 21/677* | (2006.01) | |
| *B65G 1/10* | (2006.01) | |
| *A47B 47/00* | (2006.01) | |
| *A47B 49/00* | (2006.01) | |
| *A47B 81/00* | (2006.01) | |

(52) U.S. Cl.
CPC .... *H01L 21/67769* (2013.01); *A47B 47/0083* (2013.01); *A47B 49/004* (2013.01); *A47B 49/008* (2013.01); *A47B 81/00* (2013.01); *B65G 1/10* (2013.01)

(58) Field of Classification Search
CPC ................................. H01L 21/67769
See application file for complete search history.

(56) References Cited

U.S. PATENT DOCUMENTS

| | | | | |
|---|---|---|---|---|
| 4,867,629 A | * | 9/1989 | Iwasawa | ........... H01L 21/67769 211/163 |
| 5,314,564 A | * | 5/1994 | Kobayashi | .............. B65B 61/26 156/350 |
| 5,950,643 A | * | 9/1999 | Miyazaki | ............. B28D 5/0076 134/201 |

(Continued)

FOREIGN PATENT DOCUMENTS

| | | | | |
|---|---|---|---|---|
| WO | 02/08831 A2 | 1/2002 | ................ F24F 3/16 |
| WO | 2009/114193 A2 | 9/2009 | ............. B65B 55/20 |

OTHER PUBLICATIONS

International Search Report and Written Opinion, Application No. PCT/US2016/065355, 11 pages, Mar. 29, 2017.

*Primary Examiner* — Thomas Randazzo
(74) *Attorney, Agent, or Firm* — Slayden Grubert Beard PLLC

(57) ABSTRACT

The present disclosure relates to semiconductor manufacturing, in particular to reticle rack systems. The teachings of the present disclosure may be embodied in a reticle rack unit including a frame with four uprights and multiple crossbars and four turnstiles. The frame may have a longest dimension defining a front side and a back side. The four turnstiles may be mounted to the frame to pivot around a respective rotational axis parallel to the four uprights. Each turnstile may define a plurality of reticle nests sized to hold reticles.

20 Claims, 4 Drawing Sheets

(56) References Cited

U.S. PATENT DOCUMENTS

| | | | |
|---|---|---|---|
| 6,739,820 B2* | 5/2004 | Chang | H01L 21/67769 |
| | | | 414/217.1 |
| 6,795,202 B2* | 9/2004 | Emoto | H01L 21/67265 |
| | | | 250/559.33 |
| 7,699,573 B2* | 4/2010 | Blattner | G03F 7/70741 |
| | | | 414/217 |
| 2002/0094257 A1 | 7/2002 | Babbs et al. | 414/277 |
| 2012/0083120 A1* | 4/2012 | Nakada | H01L 21/67017 |
| | | | 438/689 |
| 2013/0158701 A1 | 6/2013 | Nomura | 700/214 |
| 2017/0125273 A1* | 5/2017 | Hsu | H01L 21/6732 |

* cited by examiner

RETICLE RACK SYSTEM

CROSS-REFERENCE TO RELATED APPLICATION

This application claims priority to commonly owned U.S. Provisional Patent Application No. 62/264,098 filed Dec. 7, 2015, which is hereby incorporated by reference herein for all purposes.

TECHNICAL FIELD

The present disclosure relates to semiconductor manufacturing, in particular to reticle rack systems.

BACKGROUND

Photolithography, sometimes referred to as optical lithography or UV lithography, is a process used to pattern films or substrates in semiconductor or integrated circuit (IC) manufacturing. Lithographic photomasks are typically transparent fused silica blanks covered with a pattern defined by a light absorbing or reflecting film. A set of photomasks, each defining a pattern layer, is fed into a photolithography stepper or scanner, and individually selected for exposure. Light passes through the photomasks and hits, typically, a layer of photoresist on the substrate in the pattern of the photomask. Various chemical treatments may be used to remove the exposed portions of the photoresist (or the un-exposed portions, in a negative resist). When using photolithography for mass production of IC devices, the typical term for a photomask is photoreticle or reticle. Fabrication of some IC devices may require more than 50 exposures using different reticles.

SUMMARY

A IC manufacturing fab may employ multiple processes that each require multiple reticles. As the fab's product line or number of processes grow, storage of the many reticles becomes a challenge. The teachings of the present disclosure may be embodied in a reticle storage rack which reduces the footprint required to store as many reticles as possible.

Some embodiments of the present disclosure may include a reticle rack. The reticle rack may comprise a frame with four uprights and multiple crossbars and four turnstiles. The frame may have a longest dimension defining a front side and a back side. The four turnstiles may be mounted to the frame to pivot around a respective rotational axis parallel to the four uprights. Each turnstile may define a plurality of reticle nests sized to hold reticles.

In some embodiments, each turnstile comprises four stacks of slots, each stack including 28 slots.

In some embodiments, the plurality of reticle nests comprises 448 reticle nests.

In some embodiments, each turnstile comprises a rectangular tower.

In some embodiments, each turnstile comprises a rectangular tower including four stacks of reticle nests, and wherein a reticle can be removed from a stack only when the respective stack faces the front side of the frame.

Some embodiments may include two static emitters and two fan filter units protecting any reticles stored in the reticle rack unit from particles in air surrounding the reticle rack unit.

Some embodiments may include four brakes, each brake associated with one turnstile; and an electronic controller only allowing one brake to be disengaged at any time.

Some embodiments may include four override switches, each switch associated with one turnstile and operable to override the electronic controller and allow the associated turnstile to turn.

Some embodiments may include a set of visual signals indicating whether each brake is engaged or disengaged.

Some embodiments may include a handheld scan gun for reading a label on reticles replaced in or removed from a reticle nest of the reticle rack unit and a monitor displaying an identifying code read from the label.

Some embodiments may include a system of reticle rack units for storing reticles in a semiconductor fab, the system including multiple reticle rack units, each reticle rack unit comprising: a frame with four uprights and multiple crossbars, the frame having a longest dimension defining a front side and a back side; and four turnstiles mounted to the frame to pivot around a respective rotational axis parallel to the four uprights. Each turnstile may define a plurality of reticle nests sized to hold reticles.

In some embodiments, each turnstile comprises four stacks of slots, each stack including 28 slots.

In some embodiments, the plurality of reticle nests comprises 448 reticle nests.

In some embodiments, each turnstile comprises a rectangular tower.

In some embodiments, each turnstile comprises a rectangular tower including four stacks of reticle nests, and wherein a reticle can be removed from a stack only when the respective stack faces the front side of the frame.

Some embodiments may include two static emitters and two fan filter units protecting any reticles stored in the reticle rack unit from particles in air surrounding the reticle rack unit.

Some embodiments may include four brakes, each brake associated with one turnstile; and an electronic controller only allowing one brake to be disengaged at any time.

Some embodiments may include four override switches, each switch associated with one turnstile and operable to override the electronic controller and allow the associated turnstile to turn.

Some embodiments may include a set of visual signals indicating whether each brake is engaged or disengaged.

Some embodiments may include a handheld scan gun for reading a label on reticles replaced in or removed from a reticle nest of the reticle rack unit and a monitor displaying an identifying code read from the label.

DETAILED DESCRIPTION

Figure 1:
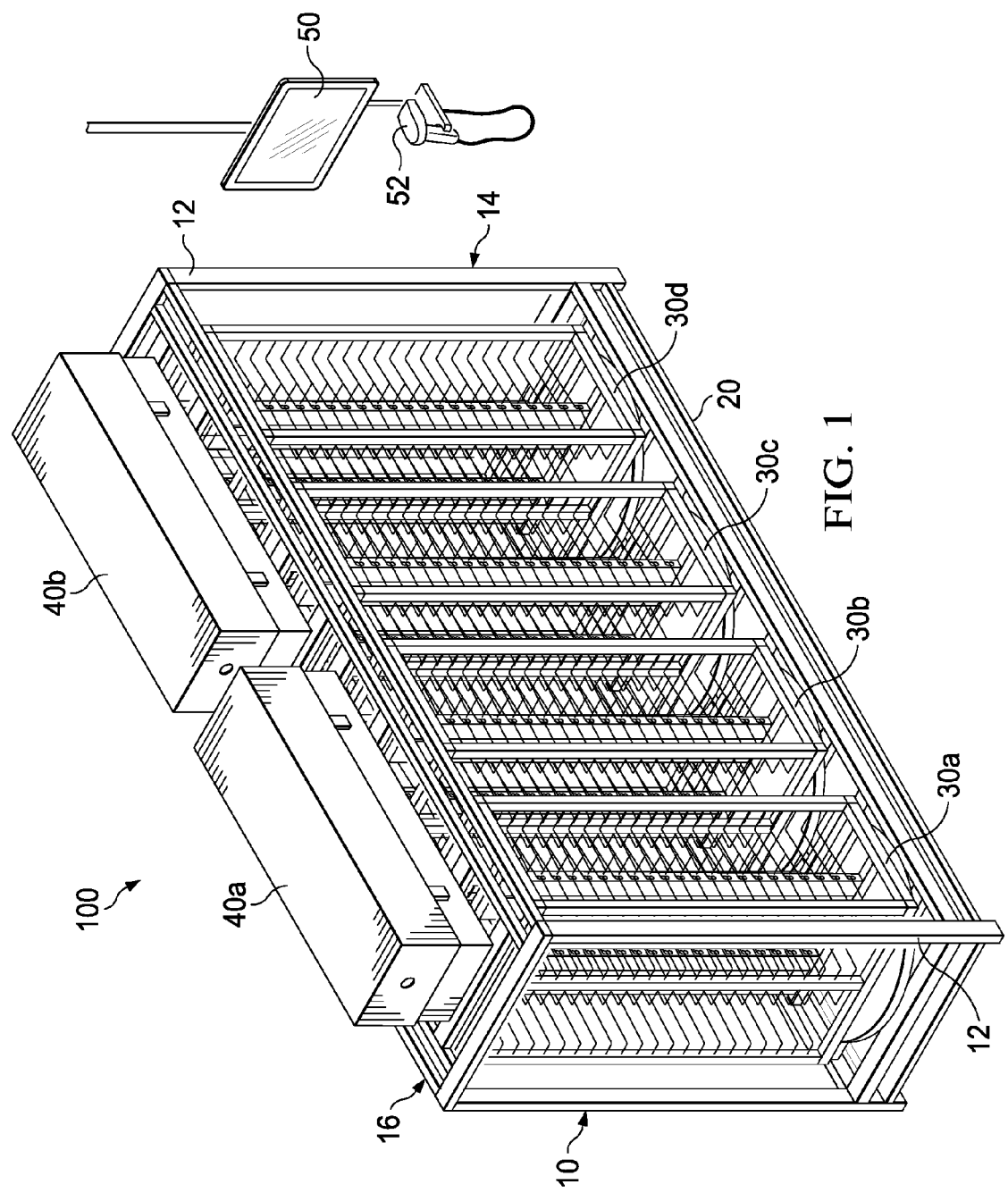
FIG. 1 is a drawing showing a reticle storage unit according to teachings of the present disclosure.

The teachings of the present disclosure may be embodied in a reticle storage rack or reticle rack unit (RRU) with a capacity for 448 reticles per rack. The reticle storage rack may include four turnstiles, each with four stacks of reticle slots or nests. In some embodiments, there may be 28 reticle nests per stack, providing 112 per turnstile. In some embodiments, there may be a system of multiple reticle racks, providing storage for more than 9,600 reticles.

The embodiments described herein may be easy to build, cost effective, and easily installed compared to conventional space saving systems that are rectangular and include push mechanisms in the center taking up valuable reticle space. Semiconductor manufacturers may have the need to store a large number of reticles. Floor space in a semiconductor fab, however, may be very costly and/or valuable so the more efficiently the reticles can be stored, the more space may be dedicated to processing equipment and/or better uses for the space.

In particular, semiconductor manufacturers may require additional storage each time they implement a new product and its attendant processes. In addition, a manufacturer may acquire a large number of reticles through the acquisition of another company and/or product line. Often, an acquired company may use a different reticle storage system and, using typical methods, harmonizing the different systems may be cost prohibitive.

Known rack systems may house 100 reticles in a similar amount of floor space as the units described herein. Other options on the market may be costly and unproven, including multiple electrical components which may be less reliable and/or more expensive. Some embodiments of the present teaching may include a brake for each turnstile to restrict rotation to a single turnstile at a time. They may further include electronic circuitry to engage and disengage the brakes. Some embodiments with a braking system may include a manual override switch allowing a user to disengage a particular brake.

Some embodiments may include two static emitters and two fan filter units per reticle rack unit. Such embodiments may provide protection from particles in the atmosphere surrounding the reticle rack units.

In some embodiments, a reticle rack unit may be built on site by the semiconductor manufacturer's personnel. In some embodiments, an RRU may be a self-contained unit with 4 turnstiles. The turnstiles may be, for example one inch apart. Each unit may include a box containing a control board for each turnstile. In such embodiments, the box controls the LEDs, the brakes, and the overrides based on position sensors. Each turnstile may be associated with a green or red LED. The LEDs indicate whether a turnstile is locked and, therefore, which turnstiles can and cannot be used.

Each turnstile may include a brake to keep it from rotating when the other turnstiles, or in some embodiments, a turnstile on either side of it is in use. Such embodiments may include an override switch in the event a turnstile and/or turnstile brake gets stuck. A turnstile may include 4 columns of reticle nests. In some embodiments, each column holds 28 reticles so the turnstile holds 112 reticles when fully loaded. An RRU with four such columns houses 448 reticles in nests.

FIG. 1 is a drawing showing a reticle rack unit 100 according to teachings of the present disclosure. Reticle rack unit 100 may include a frame 10 made up of multiple uprights 12 and multiple crossbars 20. As shown in FIG. 1, the longest dimension may be called the front side 14 and the side against the wall may be called the back side 16. The embodiment shown includes four uprights 12, but frame 10 may include any appropriate number of uprights 12 and/or crossbars 20.

Reticle rack unit 100 may include one or more turnstiles 30. In the embodiment shown, reticle rack unit 100 comprises four turnstiles 30a-d. Each turnstile 30 may be mounted to the frame 10. Each turnstile 30 may include a set of reticle nests 60 (shown in more detail in FIG. 4). The features of turnstile 30 are discussed in more detail in relation to FIG. 3. Each turnstile 30 may be mounted so as to pivot around its own longitudinal axis, with that rotational axis parallel to the uprights 12 of the frame 10. In some embodiments, each turnstile 30 may be mounted on a lazy susan style rotating pivot at the top and/or bottom of the turnstile 30.

Reticle rack unit 100 may include various electronic controls and/or components. As shown in FIG. 1, one or more control boxes 40 may be mounted to frame 10. The control boxes 40 may contain electronical controls for the brakes associated with turnstiles 30, as well as for signals indicating whether the brakes are engaged. In some embodiments, the signals may comprise LED lights (e.g., red LED for brake engaged and green LED for brake disengaged). In some embodiments, an electronic controller may allow only one brake to be disengaged at any given moment, so that only one turnstile 30 may rotate at a time. The reticle rack unit 100 may include four override switches, each switch associated with one turnstile 30 and operable to override the electronic controller and allow the associated turnstile to turn.

Control boxes 40 may further include electronics to control static emitters and fan filter units operating to protect stored reticles from any particles in the air surrounding the reticle rack unit 100. Typically, the reticle rack unit 100 may be located in a semiconductor fab with laminar air flow and/or other atmospheric controls. In some embodiments, reticle rack unit 100 may comprise two static emitters and two fan filter units protecting working in conjunction.

As shown in FIG. 1, reticle rack unit 100 may include a monitor 50 and a handheld scan gun 52. Scan gun 52 may be used to scan a label on a reticle as it is removed and/or replaced in reticle rack unit 100. Monitor 50 may be configured to display an identifying code read from the label and/or to indicate the proper reticle nest for the identified reticle. In some embodiments, scan gun 52 may be used to read a QR code or UPC code for a requested reticle from a list of options and monitor 50 may be configured to display a location for that reticle. In some embodiments, scan gun 52 may be used to select a recipe or process for photolithography from a menu and/or another list of processes and monitor 50 may be configured to identify the reticles required for that process. Monitor 50 and handheld scanner 52 may be components of or in communication with a computer, information handling system, or fab process management system used to record, direct, and/or otherwise manage fab processes.

Figure 2:
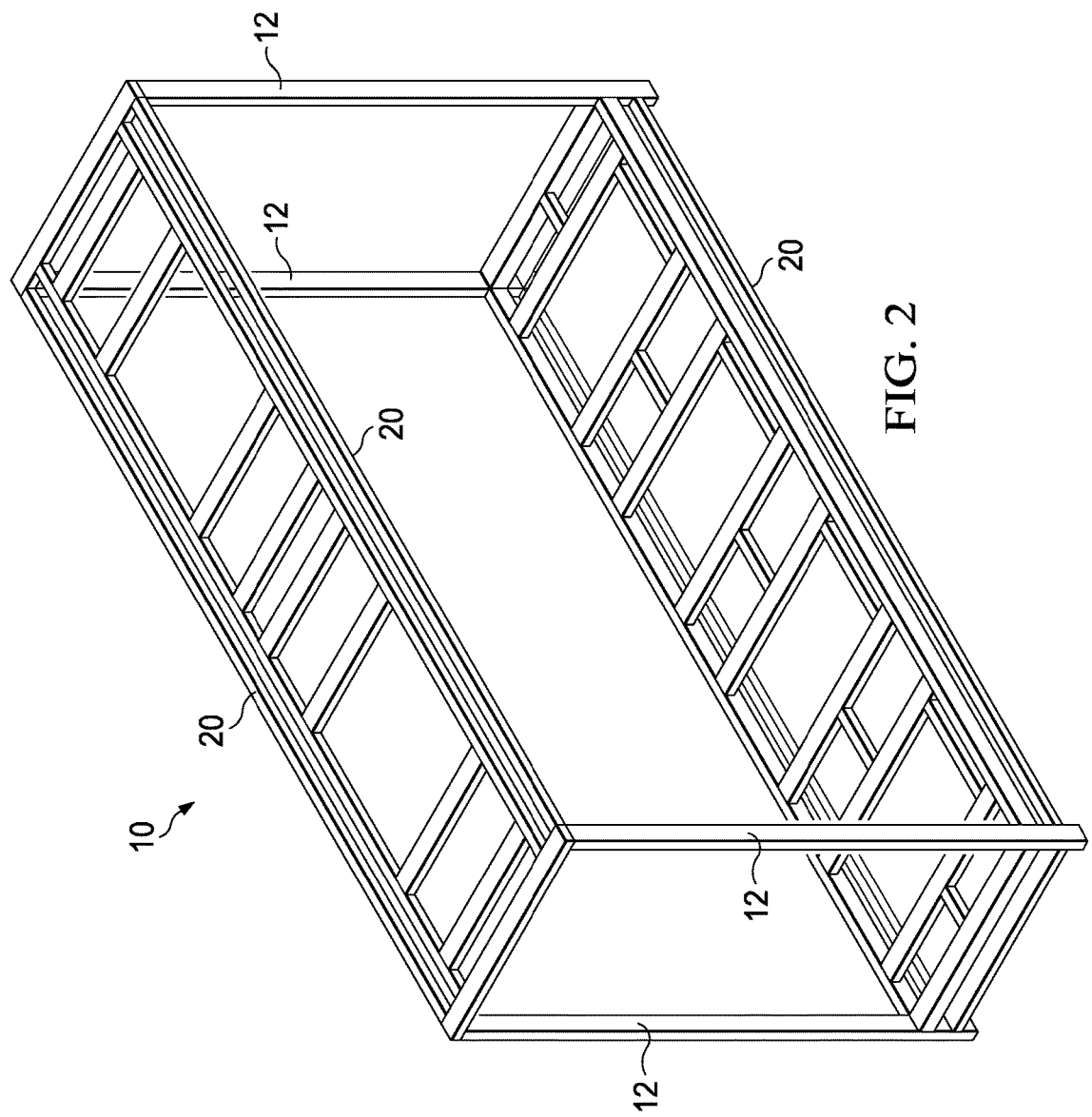
FIG. 2 is a drawing showing an example frame that may be used in the reticle storage unit in more detail according to teachings of the present disclosure.

FIG. 2 is a drawing showing an example frame 10 in more detail. As shown, frame 10 may include multiple uprights 12. In some embodiments, frame 10 may include four uprights 12, located at each corner of frame 10. Frame 10 may include a multitude of crossbeams 20. Crossbeams 12 may be used to define the size and/or shape of frame 10, connecting uprights 12, and/or providing structure for mounting additional components of reticle rack unit 100. As shown in FIG. 1, frame 10 provides mounting points for turnstiles 30a-d and control boxes 40a,b.

Figure 3:
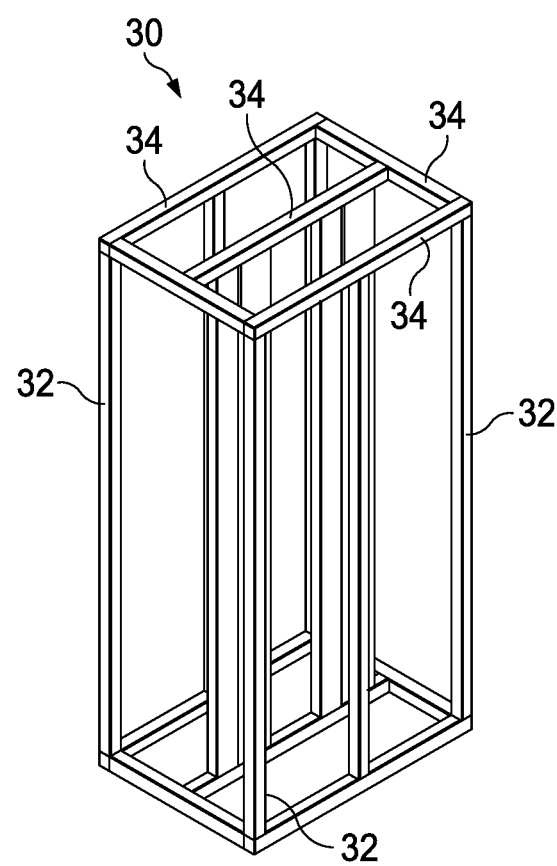
FIG. 3 is a drawing showing an example turnstile in more detail according to teachings of the present disclosure.

FIG. 3 is a drawing showing an example turnstile 30 in more detail according to teachings of the present disclosure. As shown in FIG. 3, turnstile 30 may include vertical members 32 and horizontal members 34. In the example embodiment shown, turnstile 30 comprises a rectangular tower. In general, the structure of turnstile 30 may provide four columns comprising the necessary space to house a column of reticle nests.

Figure 4:
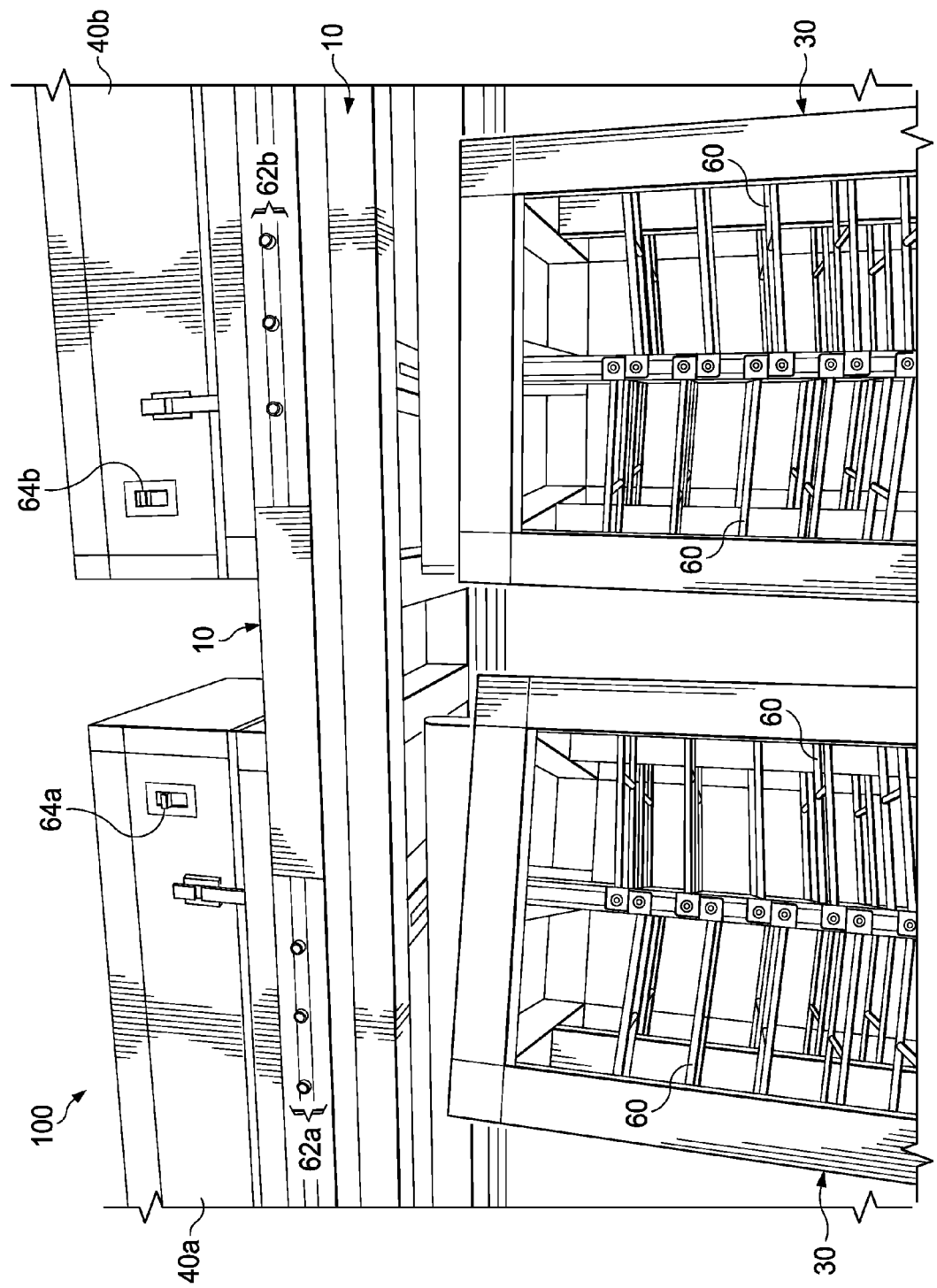
FIG. 4 is a drawing showing a portion of an example turnstile including reticle nests for storing reticles according to teachings of the present disclosure.

FIG. 4 is a drawing showing a portion of RRU 100 with turnstile 30 including reticle nests 60 for storing reticles according to teachings of the present disclosure. As shown, RRU 100 may include four turnstiles 30, each turnstile 30 with a set of reticle storage nests 60. In the example shown, each turnstile 30 includes 4 stacks or columns of reticle nests 60, one disposed in each quadrant of a cross-section taken perpendicular to the axis of rotation of the turnstile 30. In any given cross-section, there may be four reticle nests 60.

In some embodiments, each turnstile 30 includes four stacks of 28 reticle nests each, providing storage for 112 reticles in each turnstile 30. If RRU 100 includes four turnstiles 30, it provides storage for 448 reticles. An RRU designed according to the teachings of the present disclosure may provide more reticle storage per square foot of floor space required, allowing more storage in a given space, or requiring less space to store an equivalent number of reticles.

As shown in FIG. 4, a control box 40 may be mounted above each turnstile, or multiple turnstiles may share a common control box 40a,b. Control box 40 may contain any control board or electronics related to the operation of RRU 100. For example, control box 40 may contain one brake for each associated turnstile 30, a set of indicators 62, and any associated PCBs or circuitry appropriate to operate the related components. In the example embodiment shown, RRU 100 includes two LED indicators 62 for each turnstile. The LED indicators 62 may be used to indicated whether the brake associated with the turnstile 30 below the indicators 62 is engaged. In some embodiments, a green LED 62 may indicate the turnstile 30 is free to rotate and a red LED 62 may indicate the turnstile 30 is locked and/or blocked from rotating.

Control box 40 may also include an override switch 64 allowing a user to override the control system and release a brake. Override switch may include any appropriate embodiments, such as a push-button, a toggle switch, etc.

The invention claimed is:

1. A reticle rack unit comprising:
a frame with four uprights and multiple crossbars, the frame having a longest dimension defining a front side and a back side;
four turnstiles mounted to the frame to pivot around a respective rotational axis parallel to the four uprights;
wherein each turnstile defines a plurality of reticle nests sized to hold reticles.

2. A reticle rack unit according to claim 1, wherein each turnstile comprises four stacks of slots, each stack including 28 slots.

3. A reticle rack unit according to claim 1, wherein the plurality of reticle nests comprises 448 reticle nests.

4. A reticle rack unit according to claim 1, wherein each turnstile comprises a rectangular tower.

5. A reticle rack unit according to claim 1, wherein each turnstile comprises a rectangular tower including four stacks of reticle nests, and wherein a reticle can be removed from a stack only when the respective stack faces the front side of the frame.

6. A reticle rack unit according to claim 1, further comprising:
two static emitters; and
two fan filter units protecting any reticles stored in the reticle rack unit from particles in air surrounding the reticle rack unit.

7. A reticle rack unit according to claim 1, further comprising:
four brakes, each brake associated with one turnstile; and
an electronic controller only allowing one brake to be disengaged at any time.

8. A reticle rack unit according to claim 7, further comprising four override switches, each switch associated with one turnstile and operable to override the electronic controller and allow the associated turnstile to turn.

9. A reticle rack unit according to claim 7, further comprising a set of visual signals indicating whether each brake is engaged or disengaged.

10. A reticle rack unit according to claim 1, further comprising:
a handheld scan gun for reading a label on reticles replaced in or removed from a reticle nest of the reticle rack unit; and
a monitor displaying an identifying code read from the label.

11. A system of reticle rack units for storing reticles in a semiconductor fab, the system including multiple reticle rack units, each reticle rack unit comprising:
a frame with four uprights and multiple crossbars, the frame having a longest dimension defining a front side and a back side;
four turnstiles mounted to the frame to pivot around a respective rotational axis parallel to the four uprights;
wherein each turnstile defines a plurality of reticle nests sized to hold reticles.

12. A system according to claim 11, wherein each turnstile comprises four stacks of slots, each stack including 28 slots.

13. A system according to claim 11, wherein the plurality of reticle nests comprises 448 reticle nests.

14. A system according to claim 11, wherein each turnstile comprises a rectangular tower.

15. A system according to claim 11, wherein each turnstile comprises a rectangular tower including four stacks of reticle nests, and wherein a reticle can be removed from a stack only when the respective stack faces the front side of the frame.

16. A system according to claim 11, further comprising:
two static emitters; and
two fan filter units protecting any reticles stored in the reticle rack unit from particles in air surrounding the reticle rack unit.

17. A system according to claim 11, further comprising:
four brakes, each brake associated with one turnstile; and
an electronic controller only allowing one brake to be disengaged at any time.

18. A system according to claim 17, further comprising four override switches, each switch associated with one turnstile and operable to override the electronic controller and allow the associated turnstile to turn.

19. A system according to claim 17, further comprising a set of visual signals indicating whether each brake is engaged or disengaged.

20. A system according to claim 17, further comprising:
a handheld scan gun for reading a label on reticles replaced in or removed from a reticle nest of the reticle rack unit; and a monitor displaying an identifying code read from the label.

\* \* \* \* \*